United States Patent
Possin et al.

(10) Patent No.: US 6,396,046 B1
(45) Date of Patent: May 28, 2002

(54) IMAGER WITH REDUCED FET PHOTORESPONSE AND HIGH INTEGRITY CONTACT VIA

(75) Inventors: George Edward Possin, Niskayuna, NY (US); Robert Forrest Kwasnick, Palo Alto, CA (US); Ching-Yeu Wei, Niskayuna; Douglas Albagli, Clifton Park, both of NY (US)

(73) Assignee: General Electric Company, Schenectady, NY (US)

( * ) Notice: Subject to any disclaimer, the term of this patent is extended or adjusted under 35 U.S.C. 154(b) by 6 days.

(21) Appl. No.: 09/643,228

(22) Filed: Aug. 22, 2000

Related U.S. Application Data

(60) Provisional application No. 60/163,043, filed on Nov. 2, 1999.

(51) Int. Cl.⁷ .............................................. H01L 27/00
(52) U.S. Cl. .............................. 250/208.1; 250/214.1; 250/370.08
(58) Field of Search ............................. 250/208.1, 216, 250/214.1, 214 LS, 338.4, 370.08, 370.09; 257/431, 345, 291; 378/113, 114

(56) References Cited

U.S. PATENT DOCUMENTS

| | | | |
|---|---|---|---|
| 4,751,513 A | * 6/1988 | Daryoush et al. | 343/700 |
| 4,904,056 A | 2/1990 | Castleberry | |
| 5,233,181 A | 8/1993 | Kwasnick et al. | 250/208.1 |
| 5,389,775 A | 2/1995 | Kwasnick et al. | 250/208.1 |
| 5,430,298 A | 7/1995 | Possin et al. | 250/370.11 |
| 5,517,031 A | 5/1996 | Wei et al. | 250/370.08 |
| 5,610,403 A | 3/1997 | Kinsley et al. | 250/370.09 |

FOREIGN PATENT DOCUMENTS

| | | |
|---|---|---|
| JP | 09090048 | 4/1997 |
| JP | 09275202 | 10/1997 |
| JP | 10093063 | 4/1998 |
| WO | 9832173 A | 7/1998 |

OTHER PUBLICATIONS

Copending U.S. Patent Application Ser. No. 09/472,929, filed Dec. 27, 1999, by D. Albagli et al., entitled "Radiation Imager Having Light Absorbing Layer".

* cited by examiner

*Primary Examiner*—Que T. Le
(74) *Attorney, Agent, or Firm*—Lester R. Hale; Donald S. Ingraham

(57) ABSTRACT

A light block material disposed over the photosensitive region of a switching device (e.g., TFT) of a radiation imager is disclosed. The light block material prevents optical photons emitted from a scintillator from passing into the switching device and being absorbed. Cross-talk and noise in the imager are thereby reduced. Also, non-linear pixel response and spurious signals passing to readout electronics are avoided. Optionally, opaque caps comprising the same light block material may be included in the imager structure. The caps cover contact vias filled with a common electrode and located in the contact finger region of the imager. The integrity of the filled vias is thereby maintained during subsequent processing. Also disclosed is a radiation imager containing these structures.

20 Claims, 4 Drawing Sheets

IMAGER WITH REDUCED FET PHOTORESPONSE AND HIGH INTEGRITY CONTACT VIA

This application claims priority to the provisional application Serial No. 60/163,043, filed Nov. 2, 1999, assigned to the assignee herein, which provisional application is hereby incorporated by reference.

BACKGROUND OF THE INVENTION

This invention relates generally to radiation imagers, and more particularly, to the incorporation of a light block material to reduce cross-talk caused by persistent transistor photoconductivity, nonlinear pixel response, and poor contact via integrity.

Radiation imagers are typically coupled with a scintillator, wherein radiation (such as an x-ray beam, for example) absorbed in the scintillator emits optical photons which in turn pass into a light sensitive region of the imager. The imager typically comprises a significantly flat substrate (e.g., glass) on which a two dimensional array of light-sensitive pixels is disposed. Each pixel comprises a light-sensitive imaging element (photosensor), such as a photodiode, and an associated switching element, such as a thin film transistor (TFT). Both photodiodes and TFTs preferably comprise hydrogenated amorphous silicon (doped or undoped) or alloys thereof, due to the advantageous characteristics and relative ease of fabrication associated with these materials. Hydrogenated amorphous silicon is commonly referred to as "amorphous silicon" or "a-Si", and the light sensitive pixel array discussed above is typically referred to as being "active". Also contained in the active area of the imager are metal address lines electrically connected to the pixels.

A reverse-bias voltage is applied across each photodiode. Charge generated in the photodiode as a result of the absorption of light photons from the scintillator is collected by the contacts, thereby reducing the bias across the diode. This collected charge is read when the TFT switching device in the array couples the photodiode to readout electronics via an address line.

The address lines of the active array are electrically contiguous with contact fingers extending away from the active pixel region toward the edges of the substrate, where they are in turn electrically connected to contact pads, typically through contact vias. Electrical connection to external scan line drive and data line read out circuitry is made at the contact pads.

In the active region, optimal spatial resolution and contrast in the signal generated by the array is achieved when incident optical photons from the scintillator are absorbed substantially only in the photodiodes directly in line with the region of the scintillator in which the optical photons are generated. However, optical photons from the scintillator are often scattered, passing into the TFT switching devices or the address lines. Such scattering and absorption present problems of increased cross-talk and noise in the array. Cross-talk reduces the spatial resolution of the array, and absorption of optical photons in TFT switching devices can result in spurious signals being passed to the readout electronics.

Thus, although light from the scintillator discharges the reverse bias of the diode (the desired signal), the same light also impinges on the a-silicon in the TFT, producing a photocurrent, which is driven by the high source-drain voltage. This photocurrent persists even after the light is terminated. Hence, when pixels in the area under the object are read, even after the x-ray beam or other radiation is turned off, some of the persistent photocurrent from pixels not being read is integrated by the readout amplifier. Thus, an undesirable type of long range spatial cross-talk in the image is produced. An additional impact of the photocurrent is the production of a non-linear response by the pixel, which occurs because charge is lost from the photodiode due to this leakage current.

It is therefore clear that TFT photosensitivity can degrade the performance of an a-Si radiation imager, such as an x-ray imager. Furthermore, at high, but clinically relevant, x-ray exposure levels, for example, photodiodes in pixels which do not have the x-ray signal attenuated by the object under examination develop the highest field effect transistor (FET) source-drain voltages, thus increasing the FET photocurrent.

In addition to the aforementioned problems, another concern is that the integrity of the contact vias, which are located in the contact fingers outside the active region of the array, is often compromised during fabrication and processing. The contact vias are filled with a common electrode material comprising a light-transmissive conducting oxide, typically indium tin oxide (ITO), tin oxide, indium oxide, zinc oxide, or the like. External electrical connection from the contact pads to the underlying metals of the address lines extending from the active array is facilitated through the common electrode in the contact vias.

However, the relatively thin (about 100 nm) common electrode layer must form a continuous layer over an underlying, relatively thick (1 to 2 $\mu$m) light-transmissive dielectric layer in the contact vias. Because the ITO is so thin and because it may be porous due to its polycrystalline nature, contact to the underlying address line material in the contact fingers may be degraded during processing, particularly by chemical attack of the underlying metal and ITO-metal interface.

It is therefore clear that an imager array in which the TFTs are shielded from incident optical photons is desirable. Furthermore, improvement in the electrical yield and mechanical robustness of the contact vias is also desirable. A need therefore exists for a means to reduce TFT photosensitivity without otherwise degrading imager performance, while also preserving or improving the integrity of the common electrode, the contact vias, and other imager structures.

SUMMARY OF THE INVENTION

The present invention includes a structure for a radiation imager comprising an opaque shield overlying substantially all of a photosensitive region of a switching device, which is disposed on a substrate. The photosensitive region comprises a light sensitive portion of a semiconductor layer, and this light sensitive portion overlies a bottom conductive metal layer, but is free of a first top conductive metal layer and a second top conductive metal layer, which overlie the semiconductor layer. Furthermore, the structure includes a light transmissive dielectric layer overlying the photosensitive region and a common electrode disposed between the light transmissive dielectric layer and the opaque shield.

DETAILED DESCRIPTION OF THE INVENTION

The present invention addresses the problems of cross-talk caused by transistor photosensitivity, nonlinear pixel response, and contact via integrity. By incorporating a light block material into the imager structure, optical photons are prevented from passing into the switching device and being absorbed. Furthermore, if the light block material is also used to cover filled contact vias in the contact finger region of the imager, the constitution of the vias remains intact during subsequent processing.

Figure 1:
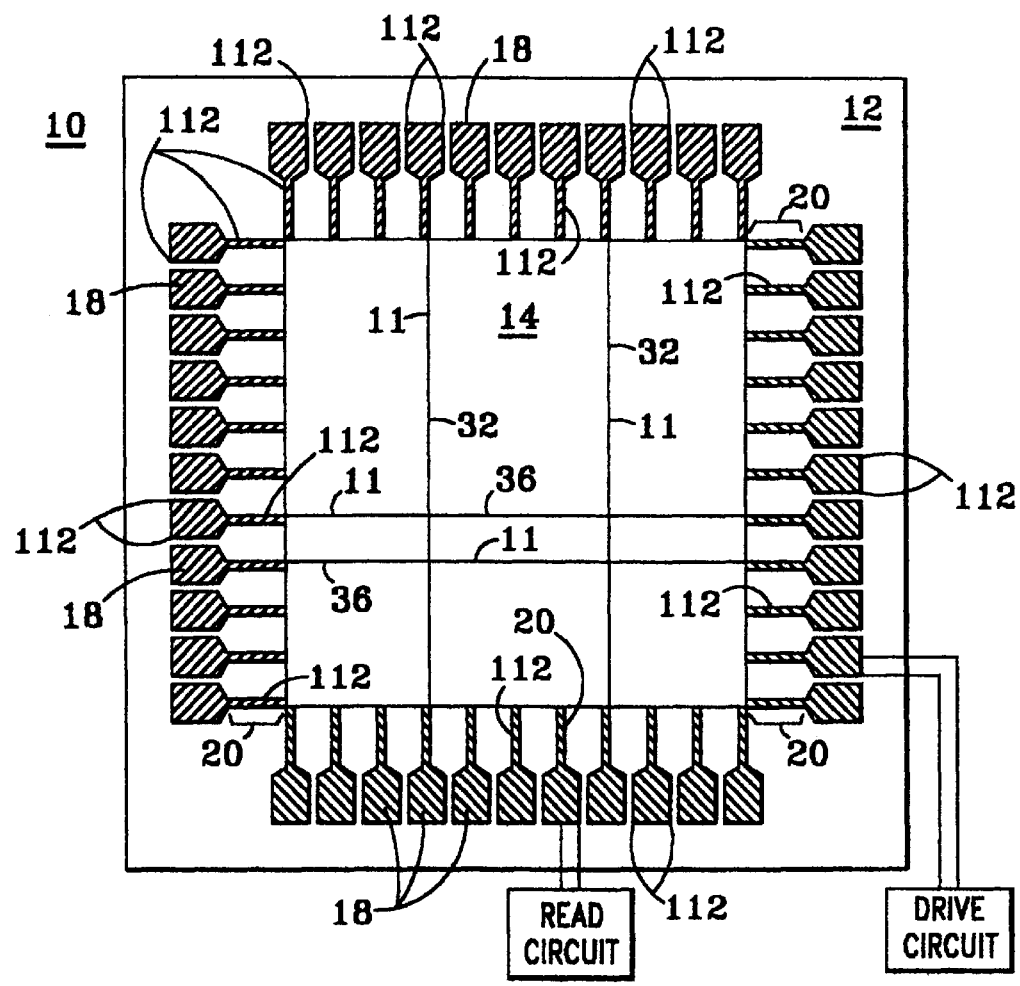
FIG. 1 is a top plan view of a radiation imager, in accordance with the present invention.

FIG. 1 is a top plan view of an exemplary radiation imager 10 in accordance with the present invention. However, for simplicity, the light blocking aspect of the present invention is not shown in FIG. 1. Imager 10 is typically formed on a generally flat substrate 12 usually made of glass. Imager 10 includes active array 14 comprising photosensors, i.e. light-sensitive imaging elements (not shown), which are preferably photodiodes. Each imaging element has an associated switching element (not shown), preferably a thin-film transistor (TFT). The combination of each photosensor and switching device (e.g., photodiode and TFT) is referred to as a "pixel". The pixels are arranged in a matrix of rows and columns, and each pixel is typically positioned in active array 14 so as to be exposed to optical photons passing from a scintillator (not shown) that is optically coupled to the imager.

It should be noted that the invention described herein is not limited to the use of TFTs and photodiodes, which are discussed throughout for exemplary purposes only. Other suitable switching devices and/or photosensors may be used instead, as will be known to those skilled in the art.

Radiation imager 10 also includes a plurality of address lines 11 for addressing individual pixels in photosensor array 14. Each address line 11 is either a data line 32 oriented substantially along a first axis 101 of imager 10 or a scan line 36 oriented substantially along a second axis 102 of imager 10. The aforementioned first and second axes are perpendicular to one another. For ease of illustration in FIG. 1, only a few data lines 32 and scan lines 36 are shown extending across array 14, although each set of such address lines 11 would typically extend across the array. Scan and data lines are arranged in rows and columns, respectively, so that any one pixel in active array 14 is addressable by one scan line and one data line. In operation, the voltage on row scan lines 36 is switched on, and thereby the TFTs, allowing the charge on each scanned line's photodiode, to be read out via the column data lines 32, which are connected to external amplifiers. Address lines 11 comprise a conductive material, such as chromium, molybdenum, aluminum, tantalum, tungsten, or the like.

As illustrated, address lines 11 (i.e. scan lines 36 and data lines 32) are disposed in the active region of the pixel array 14, with contact fingers 20 extending from the active region toward the edge of substrate 12. Each contact finger 20 is typically disposed in imager 10 such that a metal extension 112 electrically extends from a corresponding address line 11. In addition, each metal extension 112 of each contact finger 20 is electrically connected to a corresponding contact pad 18, which can be electrically coupled to an external device, as indicated as drive and read circuits in FIG. 1. However, contact pad 18 is typically disposed so as to be electrically insulated from metal extension 112, and electrical coupling thereto generally occurs through contact vias (not shown) on contact finger 20. Contact pads 18 comprise a conductive material such as aluminum, molybdenum, chromium, indium tin oxide, or the like, or alternatively, multiple layers of conductive material, such as indium tin oxide over molybdenum. Contact pads and connections through a common electrode to the array are discussed in commonly assigned U.S. Pat. No. 5,389,775 to Kwasnick et al.

Figure 2:
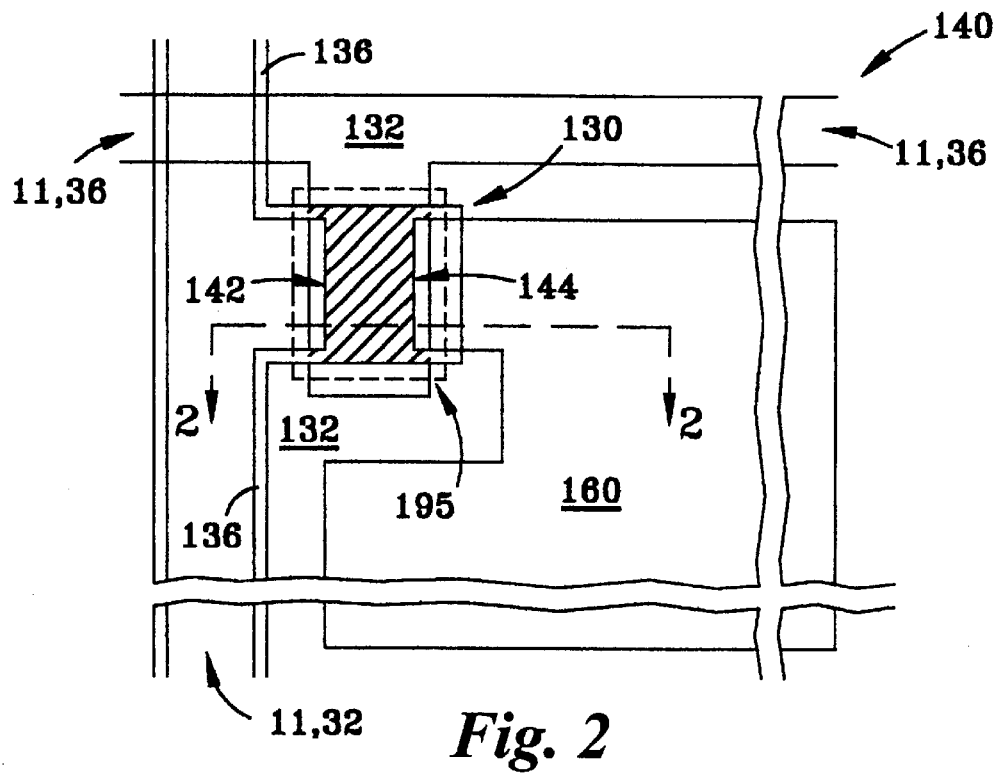
FIG. 2 is an exploded view of a segment of the active array in the imager of FIG. 1.

FIG. 2 is an enlarged plan view of a representative pixel region 140 of active array 14 of FIG. 1. Pixel region 140 includes switching device 130, typically a TFT, electrically coupled to a respective photosensor 160, typically a photodiode, and a couple of address lines 11.

In accordance with the present invention, FIG. 2 shows opaque shield 195 (the perimeter of which is indicated by dashed lines), which comprises a "light block" or opaque material, substantially covering (about 90% or more) a photosensitive region (250 in FIGS. 3 and 4) of switching device (e.g. TFT) 130. This photosensitive region includes light sensitive portion 251 of semiconductor layer 136, typically a-Si. Light sensitive portion 251 is shown in cross-hatch and overlaps bottom conductive metal layer 132, e.g. gate electrode. Overlapping semiconductor layer 136, but not covering light sensitive portion 251, are first top conductive metal layer (e.g. source electrode) 144 and second top conductive metal layer (e.g. drain electrode) 142. Thus, light sensitive portion 251 is free of first top conductive metal layer, source 144, and second top conductive metal layer, drain 142. The term "free" is used conventionally herein and refers to portion 251 not being obstructed by overlying first and second top conductive metal layers 142 and 144. Furthermore, the semiconductor material underlying source 144 and drain 142 is not deemed part of light sensitive portion 251 because source 144 and drain 142 are opaque. Channel region 145, which is part of photosensitive region 250, laterally separates first top conductive metal layer 144 (source) from second top conductive metal layer 142 (drain). Gate metal 132 also forms the scan (row) line 36 (address line 11), and drain metal 142 also forms data (column) address line 32 (or 11).

The light block material from which opaque shield 195 is formed is preferably a light-absorbing conductive metal, such as molybdenum (Mo), chromium (Cr), tantalum (Ta), aluminum (Al), or the like. However, the material may instead be a semiconductor material, such as amorphous silicon, or alternatively, a light-absorbing nonconductive material, such as a dye/organic layer or carbon on metal oxide particles dispersed in a matrix. As used herein, the terms "light block" and "opaque" both refer to a material having an absorbance greater than 1, but preferably greater than 2. "Absorbance", as used herein, is a measure of the light absorption characteristics of the material, and is determined by the negative log (base 10) of the transmittance (transmittance being the fraction of incident light passing through a sample).

Bottom conductive metal layer 132 (gate electrode) is a conductive material such as aluminum, chromium, molybdenum, tantalum, tungsten, or the like. Likewise, first top conductive metal layer (source electrode) 144 and second top conductive metal layer (drain electrode) 142 are also made of a conductive metal such as aluminum, chromium, molybdenum, tantalum, tungsten, or the like.

Figure 3:
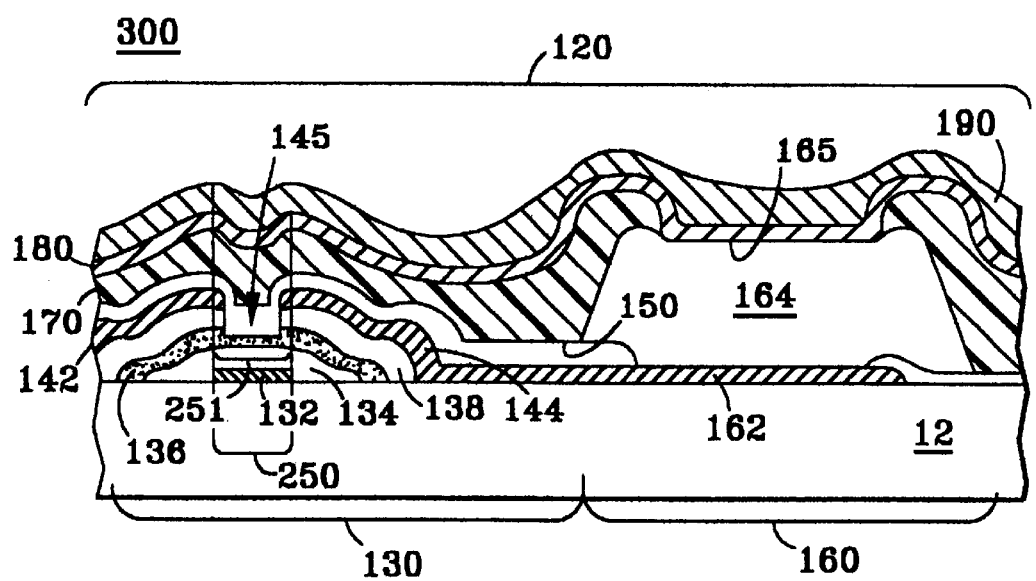
FIGS. 3 and 4 are cross-sectional views taken along lines 2—2 of a portion of the array segment of FIG. 2 during fabrication.

FIG. 3 illustrates a cross-sectional view 300 of region 140 of FIG. 2 taken along lines 2—2. However, in FIG. 3, light block material layer 190 has not yet been patterned to form opaque shield 195. In FIG. 3, representative pixel 120 from the active region of the imager, comprises TFT 130 electrically coupled to photodiode 160 by first top conductive metal layer 144, e.g. source electrode.

Figure 4:
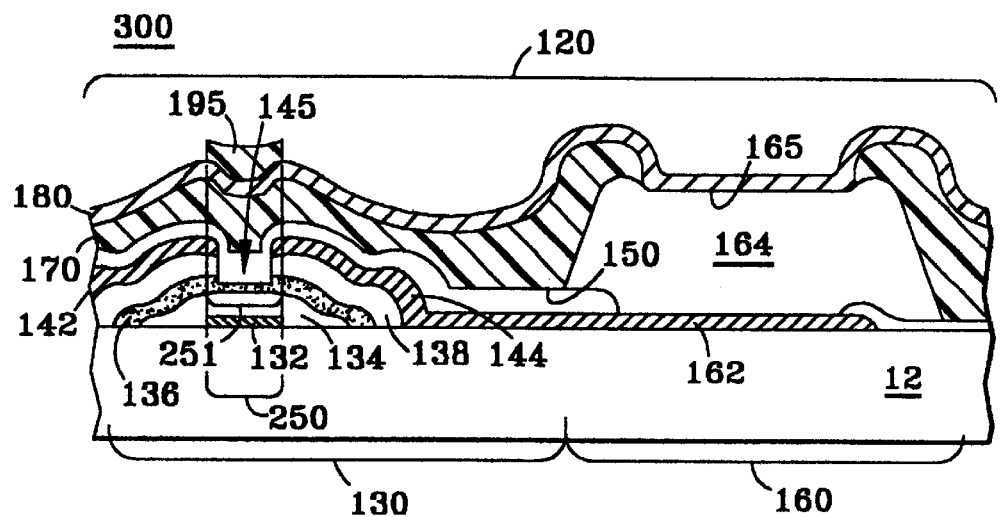

In the exemplary pixel 120 shown in FIG. 3, TFT 130 is disposed on substrate 12. Gate dielectric layer 134, which is typically an inorganic dielectric material such as silicon oxide, silicon nitride, silicon-oxy-nitride, or the like, is disposed over gate electrode 132 (i.e bottom conductive metal layer). Semiconductor layer 136 comprising amorphous silicon or the like is disposed over gate dielectric layer 134. Doped semiconductor layer 138, typically comprising n+ doped a-Si, is disposed over a-Si layer 136. These layers over gate electrode layer 132 are patterned to form the body of TFT 130. TFT 130 further comprises first top conductive metal layer, e.g. source electrode, 144 and second top conductive metal layer, e.g. drain electrode 142, which are disposed over the body of the TFT and laterally separated by channel region 145. Channel region 145 is formed by removal of n+ silicon layer 138 and part of semiconductor layer 136 in the region between source electrode 144 and drain electrode 142. TFT passivation layer 150 typically comprising an inorganic dielectric material such as silicon oxide, silicon nitride, silicon-oxy-nitride, or the like is disposed over TFT 130. TFT passivation layer 150 typically has a thickness in the range between about 0.1 $\mu$m and 1 $\mu$m. Photosensitive region 250 of TFT 130 includes light sensitive portion 251 of a-Si semiconductor layer 136 overlying gate electrode area 132, as illustrated in FIGS. 2, 3, and 4. Light sensitive portion 251 is free of the conductive metal that forms source and drain electrodes 144 and 142. The elements comprising photosensitive region 250 are all vertically aligned over substrate 12.

Photodiode 160 is disposed on substrate 12 and is electrically coupled to TFT 130 via source electrode 144. Photodiode 160 comprises bottom contact electrode 162 disposed on substrate 12 and formed from the same electrically conductive material that comprises source electrode 144. Photosensor island 164 is disposed in electrical contact with bottom contact electrode 162. Photosensor island 164 is typically mesa-shaped, having sidewalls sloping upwardly and inwardly from substrate 12 toward an upper surface 165. Photosensor island 164 typically comprises a-Si or combinations of a-Si and other materials, for example a-Si carbide or a-Si germanium. Photosensor island 164 typically further has relatively thin bands of an n-type doped region (not shown) and p-type doped region (not shown) at the bottom and top, respectively, of the island structure to enhance electrical contact with the adjoining electrode and to form the p-i-n diode structure. The thickness of photosensor island 164 is typically between about 0.1 micron and 10 microns, although in some arrangements the thickness may be greater than 10 microns. To form the desired island structure (as well as other features included in the imager), amorphous silicon and related materials are typically deposited by plasma enhanced chemical vapor deposition (PECVD) or similar methods and then patterned, for example, by etching.

In accordance with the present invention, light transmissive dielectric layer 170 is then deposited over the entire imager, including each pixel 120 of the active array and areas outside the array, such as the contact fingers (not shown). The thickness of light transmissive dielectric layer 170 typically ranges from about 0.1 $\mu$m to about 2 $\mu$m. As used herein, the term "light transmissive" means allowing at least about 10% of the incident light to pass through, but more preferably about 90% to 100%. Light transmissive dielectric layer 170 comprises either a thermally stable organic dielectric material, an inorganic dielectric material, or a combination of organic and inorganic dielectric materials (dual dielectric). Examples of suitable organic dielectrics include polyimides, polyamides, polycarbonates, polyesters, polyphenylene ether, acrylics, and blends thereof. Exemplary inorganic dielectric materials include silicon nitride and/or silicon oxide. The aforementioned dual dielectrics are discussed in commonly assigned U.S. Pat. No. 5,233,181 to Kwasnick et al.

When dielectric layer 170 is an organic polymer, such as a polyimide, conventional coating methods may be used to apply the dielectric layer to the structure. Such methods include "spinning" or "meniscus coating". Inorganic dielectrics, such as silicon oxide, silicon nitride, or silicon-oxy-nitride, can be deposited, for example, by plasma-enhanced chemical vapor deposition. A dual dielectric, typically comprising an inorganic diode dielectric and a polymer layer in various configurations, can be applied using a combination of methods.

After deposition, light transmissive dielectric layer 170 is conventionally patterned (using commonly known techniques) to uncover a plurality of contact areas. Each contact area 165 lies atop a respective photosensor or photodiode 160, as shown in FIG. 3.

After light transmissive dielectric layer 170 has been patterned, common electrode layer 180 is deposited over the imager such that it is disposed over light transmissive dielectric layer 170 and is in electrical contact with contact area 165 of photodiode 130. The thickness of common electrode layer 180 ranges from about 50 nm to about 200 nm, but is usually about 100 nm. Common electrode 180 typically comprises a light-transmissive conducting oxide (180), such as indium tin oxide, tin oxide, indium oxide, zinc oxide, or the like.

Layer 190, which comprises the previously described opaque or "light block" material, is then deposited, typically by sputtering or PECVD, over common electrode 180, covering both active and inactive regions of imager 10. The thickness of opaque layer 190 disposed on common electrode 180 preferably ranges from about 20 to about 200 nm, but is usually about 50 nm. However, a thinner or thicker layer 190 can be employed ranging from about 10 nm to about 500 nm. Relative to the opaque polymers disclosed in commonly assigned U.S. Pat. No. 5,517,031 to Wei et al., the light absorption of the present light block materials useful in forming light block layer 190 is greater than that of opaque polymers, so thinner layers, which are easier to work with, can be used.

Opaque layer 190 is then patterned using conventional methods of photolithography including etch and photoresist strip steps to form opaque shield 195, as depicted in FIGS. 2 and 4. The steps of depositing and patterning opaque layer 190 can be performed before or after deposition and/or patterning of common electrode 180. However, these steps (i.e. depositing and patterning opaque layer 190) are preferably performed after the deposition of common electrode 180, but prior to the patterning of common electrode 180. As shown in FIG. 4, opaque shield 195 substantially covers (about 90% or more) of photosensitive region 250, overlying substantially all (about 90% or more) of light sensitive region 251 of a-Si layer 136, where it overlies bottom conductive metal layer (gate electrode) 132 in the TFT region. However, shield 195 usually extends about 2 μm or more past the edges of the a-Si region 251 where it overlaps gate 132. This overlap allows for misalignment during photolithography, which is common for large area substrates. This extension is also depicted in FIG. 2, where opaque shield 195 is shown extending past region 251.

Figure 6A:
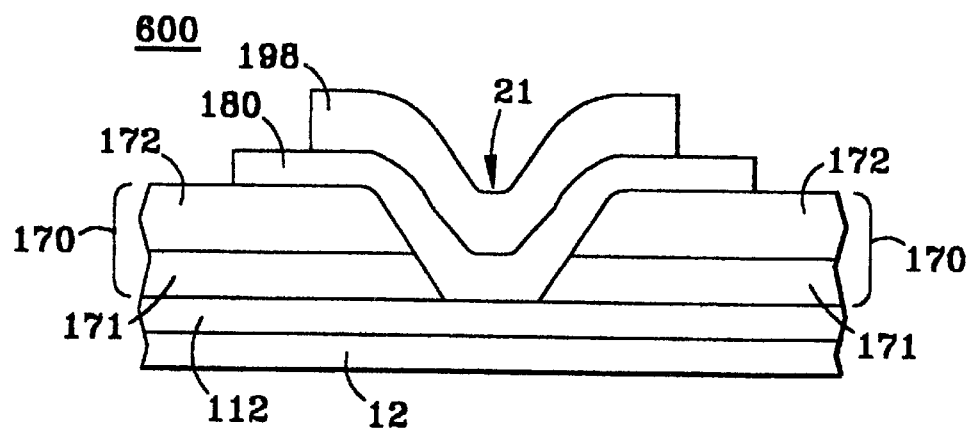
FIGS. 6a–c are cross-sectional views of exemplary embodiments taken along lines 5—5 of a portion of contact finger segment of FIG. 5.
Figure 6B:
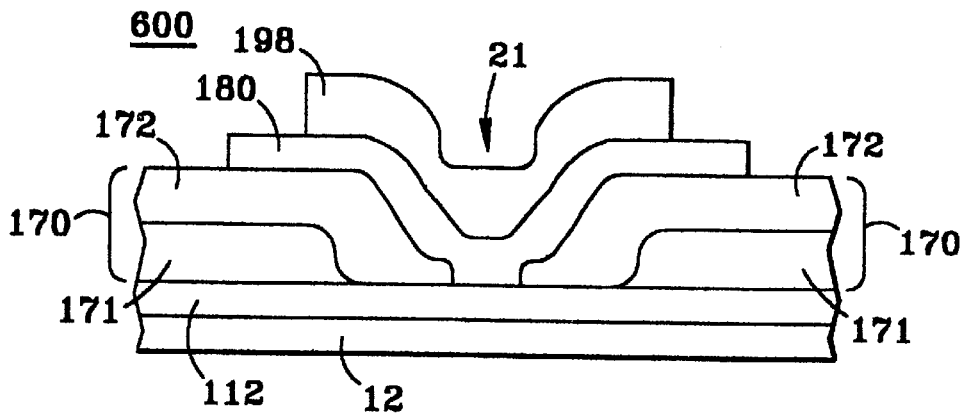
Figure 6C:
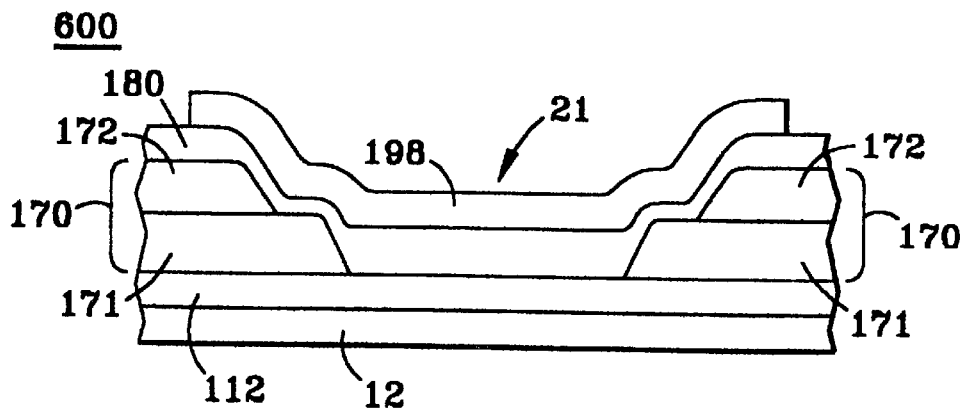

As stated above, light transmissive dielectric layer 170 is deposited over contact fingers 20, as well as active region 14 of imager 10 (FIG. 1). Thus, when light transmissive dielectric layer 170 is patterned to uncover contact areas 165 (FIG. 3), at least one contact via may also be also be formed in the dielectric layer covering each contact finger. As shown in FIGS. 6a–c, which are described in more detail below, each contact via 21 extends through light transmissive dielectric layer 170 to metal extension 112. Furthermore, at the same time common electrode 180 is deposited onto light transmissive dielectric layer 170, as previously described, it is also deposited into each contact via 21. Similarly, light block material layer 190 is deposited atop common electrode layer 180 overlying the entire imager structure 10, including contact fingers 20.

Optionally, the light block layer can be patterned simultaneously (along with the TFT opaque shield described above) to form opaque caps 198 over the filled contact vias 21. Such a cap improves the reliability of electrical contact in the via and also protects the via from attack during etch of the light block material during fabrication of the TFT opaque shields.

Figure 5:
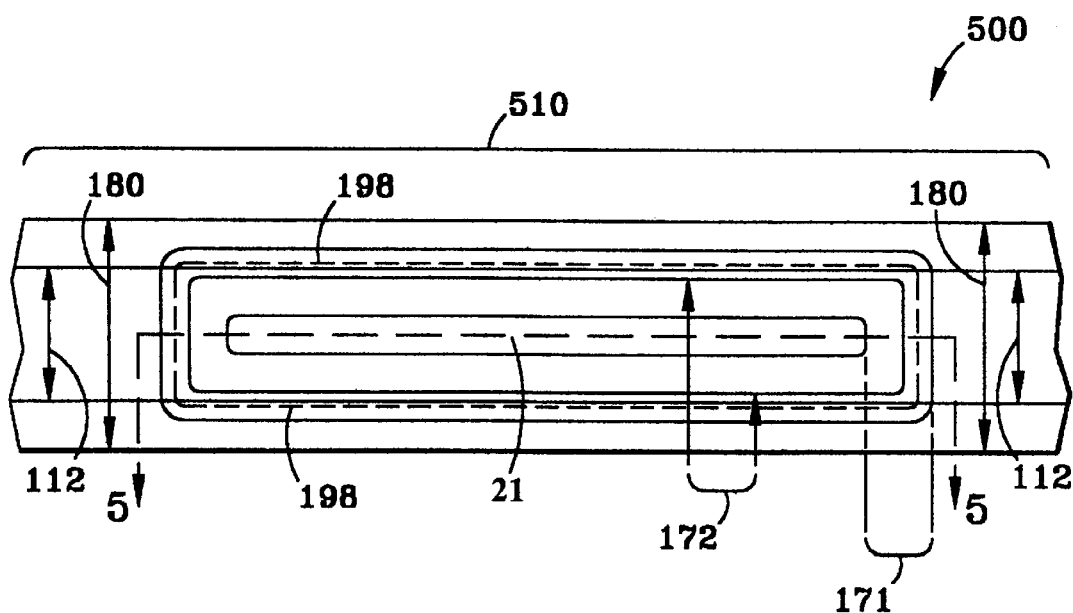
FIG. 5 is an exploded view of a segment of a contact finger in the imager of FIG. 1.

In accordance with the present invention, FIG. 5 illustrates such an opaque cap 198 and depicts an enlarged portion 500 of contact finger 20 from FIG. 1. For simplicity, the substrate on which contact finger 20 is disposed is not shown in FIG. 5. Portion 500 is a top plan view of contact via region 510 of contact finger 20 after light block material has been deposited and patterned. As shown in FIG. 5, contact via region 510 comprises metal extension 112 (e.g., molybdenum, chromium, or aluminum), which is an extension of an address line 11 from the active array 14 shown in FIG. 1. Address line 11 extends from gate electrode 232 or alternatively from drain electrode 142 of FIG. 2. Over metal extension 112 is previously described light-transmissive dielectric layer, which may be a single or double layer (dual dielectric). As shown in FIG. 5, the dielectric layer is a dual dielectric comprising inorganic dielectric layer 171 (e.g., silicon oxide, silicon nitride, or silicon-oxy-nitride) and overlying organic dielectric layer 172 (e.g., polyimide), which have been patterned to form (at least one) contact via 21. After contact via 21 has been formed, light-transmissive common electrode 180, preferably ITO, is deposited over dielectrics 171 and 172 and into contact via 21. The filled contact via 21 permits electrical connection between metal extension 112 of finger 20 and contact pad 18 (FIG. 1), which is the same material as common electrode 180 (e.g., ITO). Above common electrode 180 is opaque cap 198 (the perimeter of which is shown as dashed lines) which comprises the light block material previously discussed. Opaque cap 198 is patterned to cover substantially all (about 90% or more) of contact via 21 through which common electrode 180 connects underlying metal extension 112 (from a corresponding address line 11) and contact pad 18 (FIG. 1). Preferably, cap 198 extends about 5 μm or more past the edges of contact via 21, due to varied slope at the via edge. However, opaque cap 198 generally does not extend past the edges of the common electrode (ITO) pattern (shown in FIG. 6) to minimize the risk of shorts between neighboring contact fingers.

FIGS. 6a–c show alternative embodiments, each depicting a cross-sectional view 600 of portion 500 taken along lines 5—5 in FIG. 5. As shown in FIGS. 6a–c, metal extension 112, which is an extension of address line 11 (FIG. 1), from the active array is disposed over substrate 12. Over metal extension 112 is light-transmissive dielectric 170, which, in these depictions, is a dual dielectric comprising inorganic dielectric layer 171 (e.g., silicon oxide, silicon nitride, or silicon-oxy-nitride) and organic dielectric layer 172, which overlies all (FIG. 6a) or part (FIG. 6c) of layer 171. FIG. 6b shows an embodiment wherein inorganic dielectric layer 172 overlies layer 171 and extends over metal extension 112. Alternate embodiments include structures wherein both layers 171 and 172 are inorganic dielectrics and wherein 171 is an organic dielectric and 172 is an inorganic dielectric. In FIGS. 6a–c dielectric 170 (inorganic dielectric 171 and organic dielectric 172) has been patterned to form (at least) a contact via 21, and light transmissive common electrode 180 has been conformally deposited (that is, extends across the topography of the underlying area) over dielectric 170 and filling contact via 21. Electrical connection between underlying metal extension 112 and a contact pad 18 of FIG. 1 is thereby facilitated. Opaque cap 198 overlies substantially all of metal filled via 21, as previously described.

After opaque shield 195 (FIGS. 2 and 4), and optionally, opaque cap 198 (FIGS. 5 and 6) have been formed by photoresist patterning and etching, the patterning photoresist is removed by conventional processes, such as by plasma ashing in $O_2$ or by wet stripping, which are both well known in the art. When the light block material used to form opaque shield 195 and optional cap 198 is molybenum, then it can be wet-etched using standard etchants (e.g. Cyantek 12-S, comprising nitric and phosphoric acids), to which ITO is substantially impervious. Common electrode 180 is subsequently patterned as in prior art disclosures describing the imager process using HCl-containing etchants.

The radiation imager is completed by formation of a barrier layer (not shown) on common electrode 180, shield 195, and cap 198, followed by coupling to a scintillator (not shown). The scintillator is disposed over the active array and comprises a scintillating material selected to have a high absorption cross section for radiation of the type it is desired to detect. For example, in imagers designed for detection of x-rays, the scintillator material is typically cesium iodide doped with thallium (CsI:Th), or sodium (CsI:Na), or alternatively, the scintillator material may be a powder of gadollium oxide-sulfate (GdOS) crystals.

While the invention has been particularly shown and described with reference to preferred embodiment(s) thereof, it will be understood by those skilled in the art that various changes in form and details may be made therein without departing from the spirit and scope of the invention.

What is claimed is:

1. A structure for a radiation imager comprising:
   (a) an opaque shield comprising a light block material, wherein said opaque shield overlies substantially all of a photosensitive region of a switching device disposed on a substrate, wherein said photosensitive region comprises:
      a light sensitive portion of a semiconductor layer, wherein said light sensitive portion overlies a bottom conductive metal layer and is free of a first top conductive metal layer and a second top conductive metal layer, wherein said first top conductive metal layer and said second top conductive metal layer overlie said semiconductor layer; and (b) a light transmissive dielectric layer overlying said photosensitive region; and (c) a common electrode disposed between said light transmissive dielectric layer and said opaque shield.

2. The structure of claim 1, wherein said switching device is electrically coupled to a photosensor by said first top conductive metal layer, and wherein said photosensor is disposed over said substrate.

3. The structure of claim 1, wherein said opaque shield extends about 2 μm beyond the edges of said bottom conductive layer underlying said light sensitive portion.

4. The structure of claim 1, wherein said light block material comprises molybdenum, amorphous silicon, chromium, tantalum, or aluminum.

5. The structure of claim 1, wherein said bottom conductive metal layer comprises aluminum, chromium, molybdenum, tantalum, or tungsten.

6. The structure of claim 1, wherein said first and second top conductive metal layers and comprise aluminum, chromium, molybdenum, tantalum, or tungsten.

7. The structure of claim 1, wherein said light transmissive dielectric layer comprises an organic dielectric material, an inorganic dielectric material, a combination thereof, or multiple layers and thereof.

8. The structure of claim 7, wherein said organic dielectric material is selected from the group of polyimides, polyamides, polycarbonates, polyesters, polyphenylene ethers, acrylics, and blends thereof, and wherein said inorganic dielectric material is selected from the group of silicon oxide, silicon nitride, and silicon-oxy-nitride.

9. The structure of claim 1, wherein said common electrode is selected from the group of indium tin oxide, tin oxide, indium oxide and zinc oxide.

10. The structure of claim 1, wherein said switching device is a thin film transistor, said bottom conductive metal layer is a gate electrode, and said first and second top conductive metal layers and are, respectively, source and drain electrodes.

11. The structure of claim 1, further comprising an opaque cap overlying substantially all of a contact via formed in a contact finger, wherein said opaque cap comprises said light block material, and wherein said contact finger is disposed over said substrate and comprises:

(a) a metal extension extending laterally from said bottom conductive metal layer or from said second top conductive metal layer;

(b) said light transmissive dielectric layer disposed over said metal extension;

(c) said common electrode disposed over at least part of said light transmissive dielectric layer; and (d) said common electrode filling said contact via;

wherein said contact via extends through said light transmissive dielectric layer to said metal extension.

12. The structure of claim 11, wherein said opaque cap extends about 5 μm beyond the edges of said contact via.

13. A radiation imager disposed on a substrate, wherein said imager comprises:

(a) an active array comprising a plurality of pixels and a plurality of address lines, wherein said plurality of pixels is arranged in a matrix of rows and columns, wherein each said pixel comprises a switching device electrically coupled to a corresponding photosensor, wherein each said address line is in electrical contact with a respective pixel, and wherein each said switching device has a photosensitive region therein comprising:

a light sensitive portion of a semiconductor layer, wherein said light sensitive portion overlies a bottom conductive metal layer and is free of a first top conductive metal layer and a second top conductive metal layer, wherein said first top conductive metal layer and said second top conductive metal layer overlie said semiconductor layer;

(b) a plurality of contact fingers extending from said active array, wherein each said contact finger electrically extends from each said address line by a metal extension, and wherein each said contact finger is electrically connected with a respective contact pad;

(c) a light transmissive dielectric layer disposed over said active array and over each said metal extension of said plurality of contact fingers, except over a contact area on the upper surface of each said photosensor, wherein said light transmissive dielectric layer covering each said metal extension has at least one contact via therein, extending through said light transmissive dielectric layer to each said metal extension;

(d) a common electrode overlying said light transmissive dielectric layer and each said contact area, and filling each said contact via to electrically connect each said address line and metal extension to said respective contact pad; and (e) a plurality of opaque shields, each said opaque shield overlying substantially all of said photosensitive region of a corresponding switching device, wherein said plurality of opaque shields lies atop said common electrode.

14. The imager of claim 13, further comprising at least one opaque cap, wherein each said opaque cap overlies substantially all of a filled contact via in a corresponding contact finger.

15. The imager of claim 14, wherein each said opaque cap extends about 5 μm beyond the edges of each said filled contact via.

16. The imager of claim 14, wherein each said opaque shield and each said opaque cap comprises molybdenum, amorphous silicon, chromium, tantalum, or aluminum.

17. The imager of claim 13, wherein each said opaque shield extends about 2 μm beyond the edges of each corresponding bottom conductive layer underlying each said light sensitive portion.

18. The imager of claim 13, wherein each said photosensor is a photodiode, each said switching device is a thin film transistor, each said bottom conductive metal layer is a gate electrode, and each said first and second top conductive layer and is, respectively, a source and drain electrode.

19. The imager of claim 13, wherein said bottom conductive metal layer of each said switching device comprises aluminum, chromium, molybdenum, tantalum, or tungsten.

20. The imager of claim 13, wherein said first and second top conductive metal layers and of each said switching device comprises aluminum, chromium, molybdenum, tantalum, or tungsten.

* * * * *